United States Patent [19]

Kimura et al.

[11] Patent Number: 5,739,552
[45] Date of Patent: Apr. 14, 1998

[54] SEMICONDUCTOR LIGHT EMITTING DIODE PRODUCING VISIBLE LIGHT

[75] Inventors: Tatsuya Kimura; Zempei Kawazu, both of Tokyo, Japan

[73] Assignee: Mitsubishi Denki Kabushiki Kaisha, Tokyo, Japan

[21] Appl. No.: 547,315

[22] Filed: Oct. 24, 1995

[30] Foreign Application Priority Data

Oct. 24, 1994 [JP] Japan .................. 6-258365

[51] Int. Cl.⁶ .................................................. H01L 33/00
[52] U.S. Cl. .................. 257/89; 257/90; 257/94; 257/103
[58] Field of Search ............................. 257/89, 90, 94, 257/96, 97, 102, 103

[56] References Cited

U.S. PATENT DOCUMENTS

| | | |
|---|---|---|
| 5,138,416 | 8/1992 | Brillson . |
| 5,459,337 | 10/1995 | Ito et al. .................. 257/89 |
| 5,583,351 | 12/1996 | Brown et al. ............. 257/89 |

FOREIGN PATENT DOCUMENTS 2283079  11/1990  Japan .

OTHER PUBLICATIONS

Ikegami et al, "Electrical Characteristics Of Low Temperature Directly Bonded GaAs/InP Heterojunctions", Gallium Arsenide and Related Compounds 1992, pp. 947–948.

Tokutome et al, "High Quality MOW Structure On Si By Direct Bonding Method", Extended Abstract 28a–ZB–10 of The Japan Society of Applied Physics, 1994.

Okuno et al, "X-ray Diffraction Measurement On InP/InGaAsP Layer Directly Bonded On GaAs Substrate", Extended Abstract 31a–X–10 of The Japan Society of Applied Physics, 1994.

*Primary Examiner*—Ngân V. Ngô
*Attorney, Agent, or Firm*—Leydig, Voit & Mayer, Ltd.

[57] ABSTRACT

A method of fabricating a light emitting diode (LED) device producing visible light includes growing layers of an LED emitting blue light to form a blue LED; growing layers of an LED emitting green light to form a green LED; growing layers of an LED emitting red light to form a red LED; and uniting the three LEDs directly to each other by annealing. Therefore, an LED device that can emit light of all three colors from the same region of the LED device with variable light intensity is obtained.

25 Claims, 9 Drawing Sheets

SEMICONDUCTOR LIGHT EMITTING DIODE PRODUCING VISIBLE LIGHT

FIELD OF THE INVENTION

The present invention relates to a method for fabricating a visible LED device. More particularly, the invention relates to a method of fabricating a light emitting diode (LED) device producing visible light that can emit light of the three primary colors, i.e., red, green, and blue, from the same portion of the LED device, in which LEDs producing the respective three primary colors are located in one chip, and which have optional light intensity.

BACKGROUND OF THE INVENTION

LEDs respectively emitting the red, green, and blue light have been marketed since early times. In emitting light of other colors using the three primary colors, light rays are emitted from different portions. Therefore, in order to emit light rays of more colors, the light of the three colors is concentrated onto a place using a devised optical system, or the elements are arranged in the same plane to emit the light. However, when pictures of many colors and the like are to be produced using the the three colors, it is difficult to form these LEDs with high density.

In addition, although there is conventionally a technique of growing semiconductor crystal layers for emitting lights of a plurality of colors on a common substrate, there are limitations in the crystal structure and the growth condition of the respective crystal layers which are grown since the crystal growth is carried out on the common substrate.

As described above, in the prior art device in which respective light rays of red, green, and blue are emitted respectively by the single LED, when light of other colors is to be emitted using the LEDs of the three colors, the light of the three colors is concentrated onto a place using a devised optical system, or the respective elements are arranged in the same plane to emit the light. However, when pictures of many colors and the like are produced, it is difficult to form the light emitting portions serving as pixels in a two-dimensional shape with high density.

Further, it is very difficult to grow the crystal layers producing the LEDs of the three primary colors on the common substrate using the same crystal growth or the respective crystal growths, since the crystal structures and the growth conditions of the crystal layers emitting the three primary colors differ much from each other. In particular, the crystal layers of the blue LED cannot be grown on the GaP substrate on which the green or red LED is grown.

SUMMARY OF THE INVENTION

It is an object of the present invention to provide a method of fabricating a visible LED device that can emit light of the three primary colors, i.e., red, green, and blue, which have optional light intensity and can emit the three colors from the same portion of the LED device.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, a method of fabricating a visible LED device comprises growing crystal layers of an LED which emits blue light to form a single blue LED, growing crystal layers of an LED which emits green light to form a single green LED, growing crystal layers of an LED which emits red light to form a single red LED, and adhering the three single LEDs directly to each other or growing crystal layers of an LED which emits blue light to form a single color LED, successively growing crystal layers of LEDs which, respectively, emit green and red light to form laminated two color LEDs, and adhering the blue LED directly to the laminated green and red LEDs, by performing annealing to unite the three LEDs. Therefore, a visible LED device that can emit lights of the three colors from the same portion of the LED device, which lights have optional light intensity is obtained.

According to a second aspect of the present invention, the method of fabricating a visible LED device according to the first aspect of the invention further comprises the blue LED growth comprising successively growing a first conductivity type crystal layer and a second conductivity type crystal layer on a substrate for the blue LED, the green LED growth comprising successively growing a second conductivity type crystal layer and a first conductivity type crystal layer on a substrate for the green LED, the red LED comprising successively growing a second conductivity type crystal layer and a first conductivity type crystal layer on a substrate for the red LED, and the uniting the LEDs comprising adhering the substrate for the green LED directly to the surface of the grown crystal layer of the blue LED and adhering the surface of the grown crystal layer of the red LED directly to the surface of the grown crystal layer of the green LED by performing annealing. Further, after the adhesion, the method includes etching regions of the red, green, and blue LEDs required to form spaces for forming electrodes of the three LEDs on the respective exposed surfaces by the etching, and forming electrodes on the respective spaces and on the surface of the red LED. Therefore, a visible LED device that can emit lights of the three colors from the same portion of the LED device, and that can control the light emitting intensity of the three colors using four electrodes is obtained.

According to a third aspect of the present invention, the method of fabricating a visible LED device according to the first aspect of the invention comprises the blue LED growth comprising successively growing a first conductivity type crystal layer and a second conductivity type crystal layer on a substrate for the blue LED, the green LED growth comprising successively growing a first conductivity type crystal layer and a second conductivity type crystal layer on a substrate for the green LED, the red LED growth comprising successively growing a second conductivity type crystal layer and a first conductivity type crystal layer on a substrate for the red LED, and the uniting the LEDs comprising adhering the surface of the grown crystal layer of the green LED directly to the surface of the grown crystal layer of the blue LED by performing annealing, after the adhesion removing the substrate for the green LED, and adhering the surface of the grown crystal layer of the red LED directly to the crystal surface of the green LED with the substrate removed by performing annealing. Further, after the adhesion, the method includes removing the substrate for the red LED, etching regions of the red, green, and blue LEDs required to form spaces for forming electrodes of the three LEDs on the respective exposed surfaces by the etching, and forming electrodes on the respective spaces and on the surface of the red LED. Therefore, a visible LED device that can emit lights of the three colors from the same portion of the LED device, that can control the light emitting intensity of the three colors using four electrodes, and that can improve the precision of the electrode formation is obtained.

According to a fourth aspect of the present invention, the method of fabricating a visible LED device according to the first aspect of the invention comprises the blue LED growth comprising successively growing a first conductivity type crystal layer and a second conductivity type crystal layer on a substrate for the blue LED, the green and the red LEDs growth comprising a process of successively growing a second conductivity type crystal layer and a first conductivity type crystal layer both of which make a p-n junction of the green LED and a second conductivity type crystal layer which makes a p-n junction of the red LED with the first conductivity type crystal layer of the green LED, on a common substrate for the green and the red LEDs, and the uniting the LEDs comprising adhering the common substrate for the green and the red LEDs directly to the surface of the grown crystal layer of the blue LED by performing annealing. Further, after the adhesion, the method includes etching regions of the red, green, and blue LEDs required to form spaces for forming electrodes of the three LEDs on the respective exposed surfaces by the etching, and forming electrodes on the respective spaces and on the surface of the red LED. Therefore, a visible LED device that can emit lights of the three colors from the same portion of the LED device and that can control the light emitting intensity of the three colors using four electrodes is fabricated with the adhering process omitted.

According to a fifth aspect of the present invention, the method of fabricating a visible LED device according to the first aspect of the invention comprises the blue LED growth comprising successively growing a first conductivity type crystal layer and a second conductivity type crystal layer on a substrate for the blue LED, the green and the red LEDs growth comprising a process of successively growing a second conductivity type crystal layer and a first conductivity type crystal layer both of which make a p-n junction of the red LED and a second conductivity type crystal layer which makes a p-n junction of the green LED with the first conductivity type crystal layer of the red LED, on a common substrate for the green and the red LEDs, and the uniting the LEDs comprising adhering the surface of the grown second conductivity type crystal layer of the green LED directly to the surface of the grown crystal layer of the blue LED by performing annealing. Further, after the adhesion, the method includes removing the common substrate for the green and the red LEDs, etching regions of the red, green, and blue LEDs required to form spaces for forming electrodes of the three LEDs on the respective exposed surfaces by the etching, and forming electrodes on the respective spaces and on the surface of the red LED. Therefore, a visible LED device that can emit lights of the three colors from the same portion of the LED device and that can control the light emitting intensity of the three colors using four electrodes is fabricated with good precision and with the adhering process omitted.

According to a sixth aspect of the present invention, the method of fabricating a visible LED device according to the fourth aspect of the invention comprises the blue LED growth comprising successively growing a first conductivity type crystal layer and a second conductivity type crystal layer on a substrate for the blue LED, the green and the red LEDs growth comprising successively growing a second conductivity type crystal layer and a first conductivity type crystal layer both of which make a p-n junction of the green LED using a selective mask which is formed on a region of a common substrate for the green and the red LEDs where a first electrode is to be formed and growing a second conductivity type crystal layer which makes a p-n junction of the red LED with the first conductivity type crystal layer of the green LED using a selective mask which is formed on a region of the first conductivity type crystal layer where a second electrode is to be formed, and the uniting the LEDs comprising adhering the common substrate for the green and the red LEDs directly to the surface of the grown crystal layer of the blue LED by performing annealing. Further, after the adhesion, the method includes etching a region of the red, green, and blue LEDs required to form a space for forming a third electrode on the exposed surface by the etching, and forming electrodes on the respective regions of the surfaces of the green and the red LEDs where electrodes are to be formed and at the space formed on the exposed surface. Therefore, a visible LED device that can emit lights of the three colors from the same portion of the LED device and that can control the light emitting intensity of the three colors using four electrodes is fabricated with the adhering and etching processes omitted.

According to a seventh aspect of the present invention, the method of fabricating a visible LED device according to the fourth aspect of the invention comprises the blue LED growth comprising successively growing a first conductivity type crystal layer and a second conductivity type crystal layer on a substrate for the blue LED, the green and the red LEDs growth comprising depositing an insulating film having an opening in <11/1> direction (a direction including [11/1] direction and equivalent thereto) on a common substrate for the green and the red LEDs, selectively etching the common substrate at the opening portion, and successively growing a second conductivity type crystal layer and a first conductivity type crystal layer both of which make a p-n junction of the green LED and a second conductivity type crystal layer which makes a p-n junction of the red LED with the first conductivity type crystal layer of the green LED using the insulating film as a mask on a region of the common substrate which is removed by the etching, and the uniting the LEDs comprising adhering the common substrate for the green and the red LEDs directly to the surface of the grown crystal layer of the blue LED by performing annealing. Further, after the adhesion, the method includes etching a region of the red, green, and blue LEDs required to form a space for forming an electrode of the blue LED on the exposed surface by the etching, and forming electrodes at the space formed on the exposed surface and on the surfaces of the green and the red LEDs. Therefore, a visible LED device that can emit lights of the three colors from the same portion of the LED device and that can control the light emitting intensity of the three colors using four electrodes is fabricated with the adhering and etching processes omitted. In addition, three of the four electrodes can be arranged on the same plane.

According to an eighth aspect of the present invention, in the method of fabricating a visible LED device according to any of first to seventh aspects of the invention, the uniting the LEDs comprises forming a compound semiconductor film including In on at least one of the surfaces of the LEDs which are to be adhered directly to each other, and adhering the surfaces of the LEDs directly to each other by performing annealing. Therefore, the adhesion of the surfaces by which the LEDs are connected to each other can be improved.

According to a ninth aspect of the present invention, the method of fabricating a visible LED device according to the second aspect of the invention comprises the blue LED growth comprising successively growing a GaN buffer layer, an n type GaN contact layer, an n type AlGaN cladding layer, a p type InGaN active layer, a p type AlGaN cladding layer, and a p type GaN contact layer of the blue LED on a sapphire substrate, the green LED growth comprising successively growing a p type GaP layer and an n type GaP layer of the green LED on a p type GaP substrate, and the red LED growth comprising successively growing a p type GaAlAs cladding layer, a p type GaAlAs active layer, an n type GaAl cladding. layer, and an n type GaAlAs contact layer of the red LED on a p type GaAs substrate. Therefore, a visible LED device which is fabricated by the method according to the second aspect of the invention is realized.

According to a tenth aspect of the present invention, in the method of fabricating a visible LED device according to the second aspect of the invention, the blue LED growth comprises successively growing a GaN buffer layer, an n type GaN contact layer, an n type AlGaN cladding layer, a p type InGaN active layer, a p type AlGaN cladding layer, and a p type GaN contact layer of the blue LED on a sapphire substrate, the green LED growth comprises successively growing a p type GaP layer and an n type GaP layer of the green LED on a p type GaP substrate, the red LED growth comprises successively growing a p type GaAlAs buffer layer, a p type GaAlAs cladding layer, a p type GaAlAs active layer, an n type GaAl cladding layer, and an n type GaAlAs contact layer of the red LED on a p type GaAs substrate, and the uniting the LEDs comprises adhering the substrate for the green LED directly to the surface of the grown crystal layer of the blue LED and adhering the surface of the grown crystal layer of the red LED directly to the surface of the grown crystal layer of the green LED by performing annealing. Further, the method includes after the adhesion, removing the GaAs substrate of the red LED by etching, etching regions of the red, green, and blue LEDs to form spaces required for forming electrodes of the three LEDs on the respective exposed surfaces formed by the etching, and forming electrodes on the respective spaces and the surface of the red LED, respectively. Therefore, a visible LED device with a further improved precision in the formation of the electrodes in addition to the effect of the effect of the fabricating method according to the ninth aspect of the invention is realized.

According to an eleventh aspect of the present invention, in the method of fabricating a visible LED device according to the third aspect of the invention, the blue LED growth comprises successively growing a GaN buffer layer, an n type GaN contact layer, an n type AlGaN cladding layer, a p type InGaN active layer, a p type AlGaN cladding layer, and a p type GaN contact layer of the blue LED on a sapphire substrate, the green LED growth comprises successively growing an n type GaP layer and a p type GaP layer of the green LED on an n type GaP substrate, and the red LED growth comprises successively growing a p type GaAlAs buffer layer, a p type GaAlAs cladding layer, a p type GaAlAs active layer, an n type GaAl cladding layer, and an n type GaAlAs contact layer of the red LED on a p type GaAs substrate. Therefore, a visible LED device which is fabricated by the method according to the third aspect of the invention is realized.

According to a twelfth aspect of the present invention, in the method of fabricating a visible LED device according to the fourth aspect of the invention, the blue LED growth comprises successively growing a GaN buffer layer, an n type GaN contact layer, an n type AlGaN cladding layer, a p type InGaN active layer, a p type AlGaN cladding layer, and a p type GaN contact layer of the blue LED on a sapphire substrate, and the green and the red LEDs growth comprises a process of successively growing a p type GaP layer and an n type GaP layer both of which make a p-n junction of the green LED and a p type GaP layer which makes a p-n junction of the red LED with the n type GaP layer of the green LED, on a p type GaP substrate common for the green and the red LEDs. Therefore, a visible LED device which is fabricated by the method according to the fourth aspect of the invention is realized.

According to a thirteenth aspect of the present invention, in the method of fabricating a visible LED device according to the fifth aspect of the invention, the blue LED growth comprises successively growing a GaN buffer layer, an n type GaN contact layer, an n type AlGaN cladding layer, a p type InGaN active layer, a p type AlGaN cladding layer, and a p type GaN contact layer of the blue LED on a sapphire substrate, and the green and the red LEDs growth comprises a process of successively growing a p type GaP layer and an n type GaP layer both of which make a p-n junction of the red LED and a p type GaP layer which makes a p-n junction of the green LED with the n type GaP layer of the red LED, on a p type GaP substrate common for the green and the red LEDs. Therefore, a visible LED device which is fabricated by the method according to the fifth aspect of the invention can be realized.

According to a fourteenth aspect of the present invention, in the method of fabricating a visible LED device according to the sixth aspect of the invention, the blue LED growth comprises successively growing a GaN buffer layer, an n type GaN contact layer, an n type AlGaN cladding layer, a p type InGaN active layer, a p type AlGaN cladding layer, and a p type GaN contact layer of the blue LED on a sapphire substrate, and the green and the red LEDs growth comprises successively growing a p type GaP layer and an n type GaP layer both of which make a p-n junction of the green LED using a selective mask which is formed on a region of a p type GaP substrate common for the green and the red LEDs where a first electrode is to be formed and growing a p type GaP layer which makes a p-n junction of the red LED with the n type GaP layer of the green LED using a selective mask which is formed on a region of the n type GaP layer where a second electrode is to be formed. Therefore, a visible LED device which is fabricated by the method according to the sixth aspect of the invention is realized.

According to a fifteenth aspect of the present invention, in the method of fabricating a visible LED device according to the seventh aspect of the invention, the blue LED growth comprises successively growing a GaN buffer layer, an n type GaN contact layer, an n type AlGaN cladding layer, a p type InGaN active layer, a p type AlGaN cladding layer, and a p type GaN contact layer of the blue LED on a sapphire substrate, and the green and the red LEDs growth comprises depositing an insulating film having an opening in <11/1> direction (a direction including [11/1] direction and equivalent thereto) on a p type GaP substrate common for the green and the red LEDs, selectively etching the p type GaP substrate, and successively growing a p type GaP layer and an n type GaP layer both of which make a p-n junction of the green LED and a p type GaP layer which makes a p-n junction of the red LED with the n type GaP layer of the green LED using the insulating film as a mask on a region of the common substrate which is removed by the etching. Therefore, a visible LED device which is fabricated by the method according to the seventh aspect of the invention can be realized.

DETAILED DESCRIPTION OF THE PREFERRED EMBODIMENT

[Embodiment 1]

FIGS. 1(a)–1(e) are sectional views illustrating process steps in a method of fabricating an LED device according to a first embodiment of the present invention. In the first embodiment of the invention, after growing LEDs which emit light of the three primary colors of red, preen, and blue on respective substrates, the LEDs are adhered with pressure with heated and electrodes are formed thereon to form the LEDs producing the three primary colors into one chip.

A description is given of the fabricating method.

Figure 1:
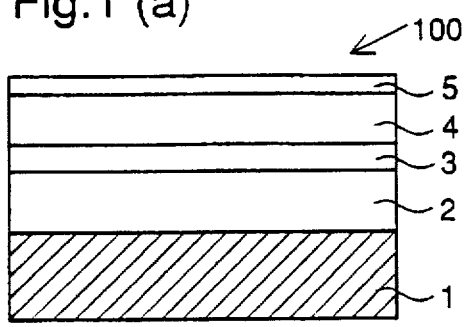
FIGS. 1(a)–1(e) are sectional views illustrating process steps in a method of fabricating an LED device in accordance with a first embodiment of the present invention.
Figure 1:
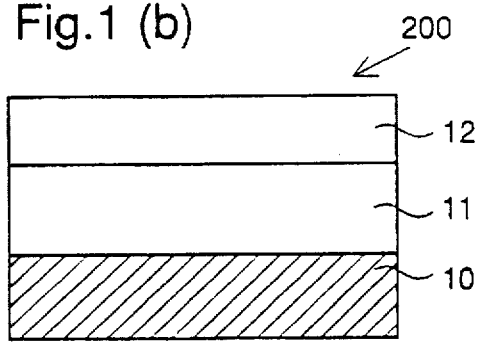
Figure 1:
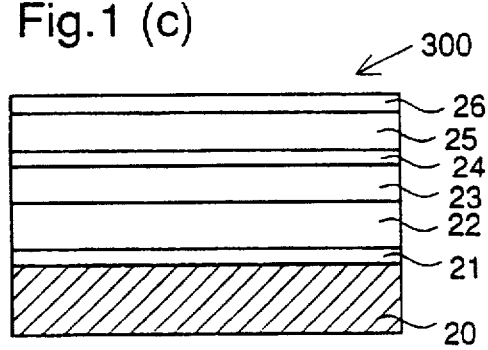
Figure 1:
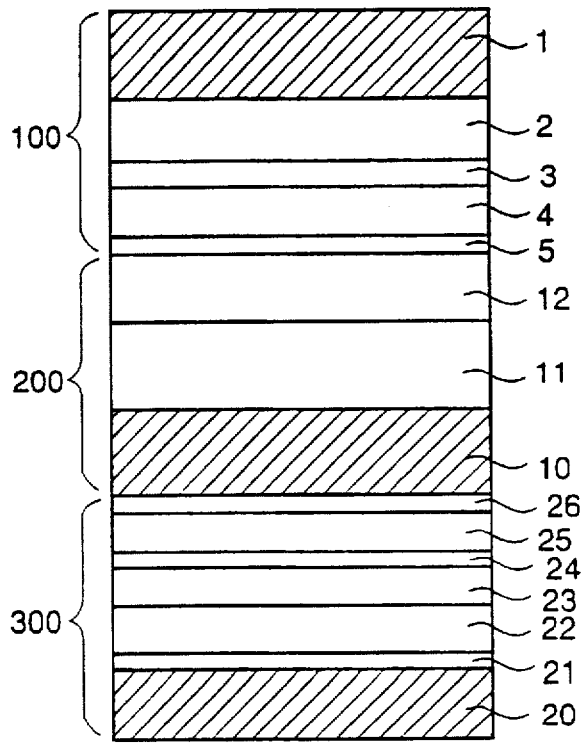
Figure 1:
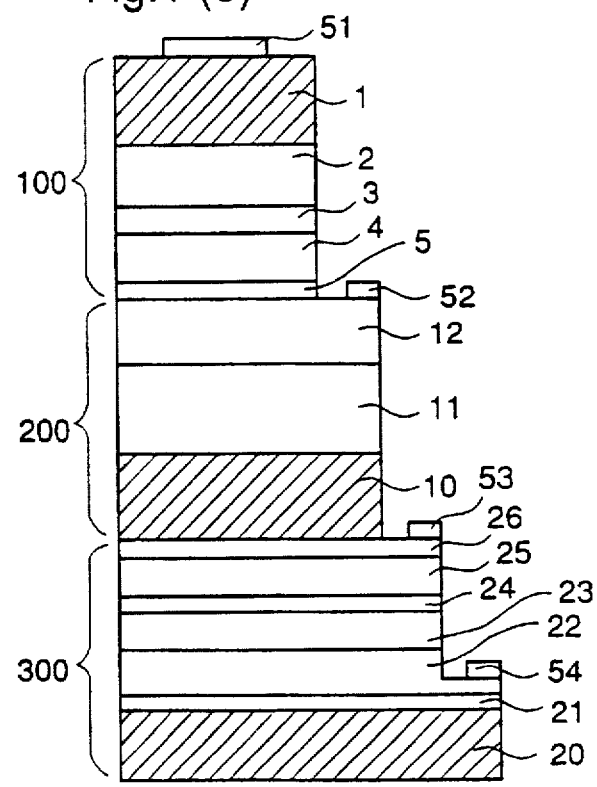

Initially, as shown in FIG. 1(a), a p type $Ga_{0.2}Al_{0.8}As$ cladding layer 2 having a thickness of 2 μm and a carrier concentration of $1 \times 10^{18}$ cm$^{-3}$ an undoped p type $Ga_{0.65}Al_{0.35}As$ active layer 3 having a thickness of 0.1 μm and a carrier concentration of $1 \times 10^{17}$ cm$^{-3}$ an n type $Ga_{0.2}Al_{0.8}As$ cladding layer 4 having a thickness of 2 μm and a carrier concentration of $1 \times 10^{18}$ cm$^{-3}$, and an n type $Ga_{0.3}Al_{0.7}As$ contact layer 5 having a thickness of 1 μm and a carrier concentration of $1 \times 10^{18}$ cm$^{-3}$ are successively grown on a p type GaAs substrate 1 having a thickness less than about 300 μm using liquid phase epitaxy (hereinafter referred to as LPE), metal organic chemical vapor deposition (hereinafter referred to as MOCVD), or molecular beam epitaxy (hereinafter referred to as MBE), thereby forming a red LED 100.

Then, as shown in FIG. 1(b), a p type GaP layer 11 having a thickness of 2 μm and a carrier concentration of $1 \times 10^{18}$ cm$^{-3}$, and an n type GaP layer 12 having a thickness of 2 μm and a carrier concentration of $1 \times 10^{18}$ cm$^{-3}$ are successively grown on a p type GaP substrate 10 having a thickness less than about 300 μm using LPE, thereby forming a green LED 200.

Then, as shown in FIG. 1(c), a GaN buffer layer 21 having a thickness of 500 Å, an n type GaN contact layer 22 having a thickness of 1 μm and a carrier concentration of $1 \times 10^{18}$ cm$^{-3}$, an n type $Al_{0.15}Ga_{0.85}N$ cladding layer 23 having a thickness of 0.5 μm and a carrier concentration of $1 \times 10^{18}$ cm$^{-3}$, a p type $In_{0.06}Ga_{0.94}N$ active layer 24 having a thickness of 200 Å, a p type $Al_{0.15}Ga_{0.85}N$ cladding layer 25 having a thickness of 0.5 μm and a carrier concentration of $1 \times 10^{18}$ cm$^{-3}$ and a p type GaN contact layer 26 having a thickness of 1 μm and a carrier concentration of $1 \times 10^{18}$ cm$^{-3}$ are successively grown on a sapphire substrate 20 having a thickness less than about 300 μm using MOCVD, followed by performing annealing of the resulting crystal growth layers under an $N_2$ atmosphere at 700° C., thereby forming a blue LED 300.

After the crystal growth of the LEDs emitting the respective red, green, and blue light as described above, surface processing is performed by ammonia and concentrated sulfuric acid or the like as a wet treatment, following by rinsing and drying. Thereafter, the p type GaP substrate 10 of the green LED is put directly on the p type GaN contact layer 26 of the blue LED and the n type $Ga_{0.3}Al_{0.7}As$ contact layer 5 of the red LED is put directly on the n type GaP layer 12 of the green LED. Then, a load of about 30 g/cm$^2$ is applied on the p type GaAs substrate 1 of the red LED, and the LEDs are adhered with pressure by performing annealing under an $H_2$ atmosphere at 700° C. for an hour. Further, the LEDs are adhered with pressure by performing annealing under an $N_2$ atmosphere at 700° C. for an hour, whereby the p type GaN contact layer 26 of the blue LED and the p type GaP substrate 10 of the green LED are adhered to each other, and the n type GaP layer 12 of the green LED and the n type $Ga_{0.3}Al_{0.7}As$ contact layer 5 of the red LED are adhered to each other as shown in FIG. 1(d).

In the step of FIG. 1(e), using ordinary photolithograph and etching techniques, portions of the LEDs are respectively removed and, then, electrodes are formed on the p type GaAs substrate 1 and on the exposed surfaces of the n type GaP layer 12, the p type GaN contact layer and the n type GaN contact layer 22 which are formed after the respective portions of the LEDs are removed, resulting in a visible light LED device.

In this first embodiment of the present invention, when the p type and n type layers shown in FIGS. 1(a)–1(c) are reversed, there are eight ways of combing the layers. In the two combinations among the eight combinations in which the layers which are adhered directly to each other have the same conductivity types, the same structure as in the first embodiment can be employed. In the structure shown in FIG. 1(d), however, it is necessary to arrange the LEDs emitting the blue, green, and red light in this order from the side close to the sapphire substrate. In addition, although the sapphire substrate is used as a substrate for the blue LED, it may be any substrate which does not absorb visible light and on which the GaN layer can be grown.

A description is given of the operation of the LED device which is fabricated as described above.

For example, when red light is emitted, a forward bias voltage is applied across the electrodes 51 and 52. When purple light is emitted, a forward bias voltage is applied across the electrodes 51 and 52 and across the electrodes 53 and 54. In this way, since a forward bias voltage of required quantity is applied across electrodes required for making a desired color, which electrodes correspond to the LEDs producing the three colors, the light of the desired color can be emitted in the direction of the sapphire substrate.

A description is given of the function of the device.

In the first embodiment of the invention, since the red, green, and blue LEDs which are separately formed are mounted so that the respective adhered surfaces have the same conductivity types and annealing is performed so that the LEDs are adhered directly to each other, light of the three colors can be emitted in the direction of the sapphire substrate 20 with optional light intensity, whereby a visible LED device that can produce all colors is obtained. In addition, since the conductivity types of respective adhered surfaces are the same, the light emission intensity of the three colors can be controlled by the four electrodes.

As described above, in the first embodiment, the red, green, and blue LEDs are separately formed, and the p type GaP substrate 10 of the green LED and the p type GaN contact layer 26 of the blue LED are adhered directly to each other and the n type $Ga_{0.3}Al_{0.7}As$ contact layer 5 of the red LED and the n type GaP layer 12 of the green LED are adhered to each other by performing annealing. Then, portions of the LEDs are respectively removed by etching and then, the electrodes 51, 52, 53, and 54 are formed on the p type GaAs substrate 1 and on the exposed surfaces of the n type GaP layer 12, the p type GaN contact layer 26, and the n type GaN contact layer 22, which are formed by the etching. Therefore, by controlling forward bias voltages applied between the electrodes 51 and 52, between the electrodes 52 and 53, and between the electrodes 53 and 54, a visible LED device that can emit light of all colors from the same portion is obtained.

[Embodiment 2]

Figure 2:
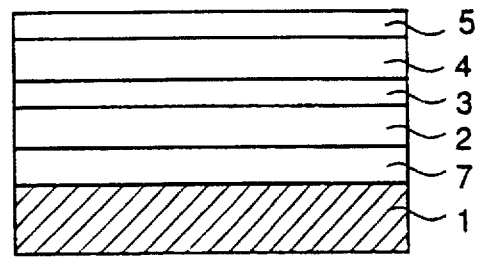
FIGS. 2(a) and 2(b) are sectional views illustrating process steps in a method of fabricating an LED device in accordance with a second embodiment of the present invention.
Figure 2:
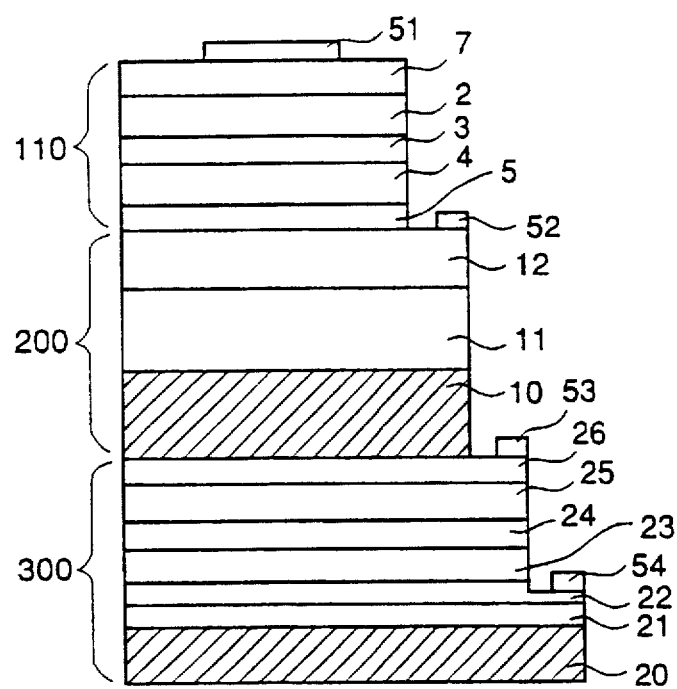

FIGS. 2(a) and 2(b) are sectional views illustrating process steps in a method of fabricating an LED device according to a second embodiment of the present invention. In the second embodiment of the invention, in the crystal growth of the red LED, after a buffer layer is formed on a substrate, the crystal layers of the first embodiment are successively grown thereon and then, the substrate for the red LED is removed after the adhering process.

The blue and green LEDs are formed as in the first embodiment of the invention. In the red LED, as shown in FIG. 2(a), a p type $Ga_{0.35}Al_{0.65}As$ buffer layer 7 is grown on a p type GaAs substrate 1 using LPE, or using MOCVD and MBE. Thereafter, as in the first embodiment, a p type $Ga_{0.2}Al_{0.8}As$ cladding layer 2, a p type $Ga_{0.65}Al_{0.35}As$ active layer 3, an n type $Ga_{0.2}Al_{0.8}As$ cladding layer 4, and an n type $Ga_{0.3}Al_{0.7}As$ contact layer 5 are successively grown thereon.

Then, as described for the first embodiment, after the p type GaP substrate 10 of the green LED and the p type GaN contact layer 26 of the blue LED, and the n type $Ga_{0.3}Al_{0.7}As$ contact layer 5 of the red LED and the n type GaP layer 12 of the green LED are directly adhered to each other, respectively, the p type GaAs substrate 1 is removed using an ammonia based selective etching solution. Thereafter, in the step of FIG. 2(b), electrodes 51, 52, 53, and 54 are formed, resulting in a visible LED device.

A description is given of the function of the device.

In the first embodiment of the invention, the whole thickness of the device exceeds 600 μm. Most of the thickness is due to the thicknesses of the substrates 1 and 10 of the red and green LEDs. In etching the respective layers of the n type GaP layer 12, the p type GaN contact layer 26, and the n type GaN contact layer 22 serving as electrode forming layers having a thickness of several μm, it is necessary to etch the substrates 1 and 10 having a thickness of about 300 μm, respectively, thereby resulting in difficulty in controlling the etching conditions while forming the electrodes. In addition, since the substrates which have no direct relation to the operation of the device are present in the structure fabricated, the light emission efficiency of the element is lowered. Therefore, in this second embodiment, the p type $Ga_{0.35}Al_{0.65}As$ buffer layer 7 is grown on the p type GaAs substrate 1 in the formation of the red LED, and subsequently, the p type $Ga_{0.2}Al_{0.8}As$ cladding layer 2, the p type $Ga_{0.65}Al_{0.35}As$ active layer 3, the n type $Ga_{0.2}Al_{0.8}As$ cladding layer 4, and the n type $Ga_{0.3}Al_{0.7}As$ contact layer 5 are successively grown thereon, followed by the removal of the p type GaAs substrate 1 after the adhering process. Consequently, in the etching for forming the spaces on which the electrodes are formed, the thickness of the crystal layer which is removed by the etching can be made thinner, thereby resulting in improved precision in the etching.

As described above, in the second embodiment of the invention, the blue and green LEDs are formed as in the first embodiment of the invention, and a p type $Ga_{0.35}Al_{0.65}As$ buffer layer 7, a p type $Ga_{0.2}Al_{0.8}As$ cladding layer 2, a p type $Ga_{0.65}Al_{0.35}As$ active layer 3, an n type $Ga_{0.2}Al_{0.8}As$ cladding layer 4, and an n type $Ga_{0.3}Al_{0.7}As$ contact layer 5 are successively grown on the p type GaAs substrate 1 to form the red LED. Then, as in the first embodiment, the p type GaP substrate 10 of the green LED and the p type GaN contact layer 26 of the blue LED, and the n type $Ga_{0.3}Al_{0.7}As$ contact layer 5 of the red LED and the n type GaP layer 12 of the green LED are directly adhered to each other, respectively, and then the p type GaAs substrate 1 is removed. Then, portions of the LEDs are respectively removed by etching and then, the electrodes 51, 52, 53, and 54 are formed on the P type GaAlAs buffer layer 7 and the exposed surfaces of the n type GaP layer 12, the p type GaN contact layer 26, and the n type GaN contact layer 22, which surfaces are formed after the respective portions of the LEDs are removed. Therefore, in the etching for forming the electrodes, the thickness of the crystal layers which are partially removed by the etching can be made thinner by the thickness of the substrate for the red LED with relative to that in the first embodiment, thereby resulting in an improved precision in etching the n type GaP layer 12.

[Embodiment 3]

FIGS. 3(a)–3(e) are sectional views illustrating process steps in a method of fabricating an LED device according to a third embodiment of the present invention. FIG. 4 is a sectional view illustrating an LED device which is fabricated by the method of the third embodiment of the invention. In the third embodiment of the invention, the growth order of the crystal layers described for the first and second embodiments of the invention is changed in the formation of the green LED, and the substrate for the green LED is also removed.

The blue LED is formed as in the first embodiment of the invention and the red LED is formed as in the second embodiment of the invention.

Figure 3:
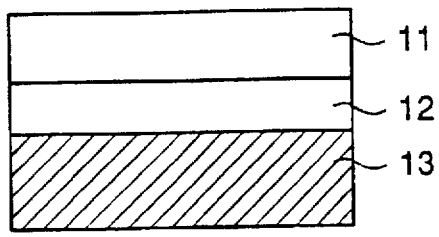
FIGS. 3(a)–3(e) are sectional views illustrating process steps in a method of fabricating an LED device in accordance with a third embodiment of the present invention.
Figure 3:
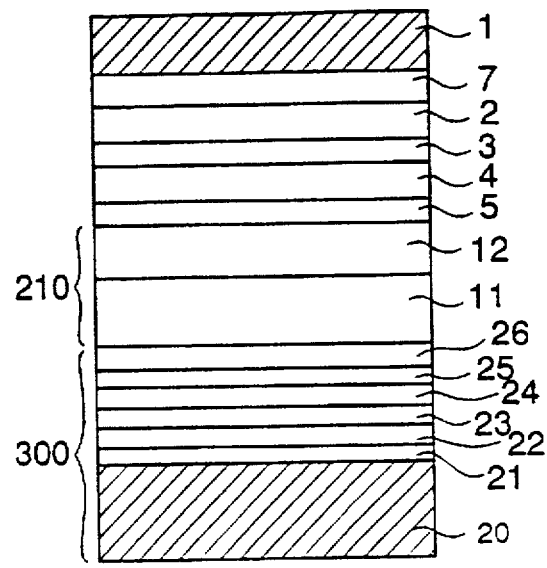
Figure 3:
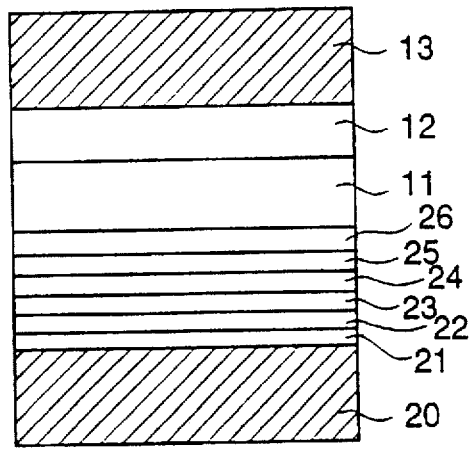
Figure 3:
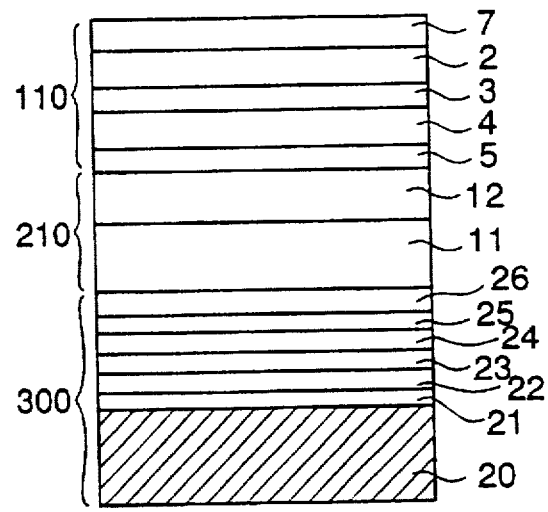
Figure 3:
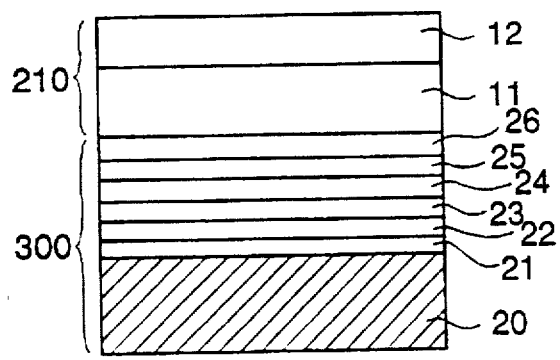
Figure 4:
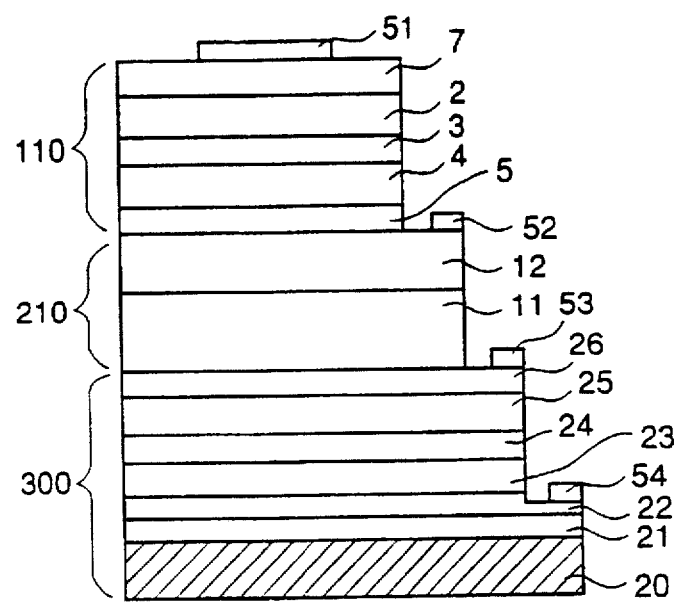
FIG. 4 is a sectional view illustrating an LED device according to the third embodiment of the invention.

In the formation of the green LED, as shown in FIG. 3(a), an n type GaP layer 12 and a p type GaP layer 11 are successively grown on an n type GaP substrate 13 using LPE. Then, surface processing is performed to the device by ammonia, concentrated sulfuric acid, or the like as a wet treatment, followed by rinsing and drying. In the step of FIG. 3(b), the p type GaP layer 11 of the green LED and the p type GaN contact layer 26 of the blue LED are directly adhered to each other by performing annealing under an $H_2$ atmosphere at 700° C. Thereafter, the n type GaP substrate 13 is ground to a thickness of 100 μm and the n type GaP substrate 13 is etched to reach the n type GaP layer 12, thereby forming the crystal structure as shown in FIG. 3(c).

Further, the n type $Ga_{0.3}Al_{0.7}As$ contact layer 5 of the red LED and the n type GaP layer 12 of the crystal surface shown in FIG. 3(c) are adhered to each other by the annealing which is performed under an $H_2$ atmosphere at 700° C. as shown in FIG. 3(d). Then, the annealing is performed under an $N_2$ atmosphere, followed by the removal of the p type GaAs substrate 1 as in the second embodiment of the invention, thereby forming the united crystal layers as shown in FIG. 3(e). By etching this united element, portions of the LEDs are respectively removed and, then, electrodes are formed on the p type GaAlAs buffer layer 7 and the exposed surfaces of the n type GaP layer 12, the p type GaN contact layer 26, and the n type GaN contact layer 22, which are formed after the respective portions of the LEDs are removed, thereby resulting in an LED device shown in FIG. 4.

A description is given of the function of the device.

As described for the second embodiment of the invention, most of the thickness of the device is the thickness of the substrate 10 of the green LED. In the formation of the green LED according to the third embodiment of the invention, the growth order of the crystal layers described for the first and second embodiments of the invention is reversed so, the n type GaP substrate 13 which is a substrate for green LED can be removed. Further, by growing the crystal layers of the red LED as in the second embodiment, the p type GaAs substrate 1 which is a substrate for red LED can be removed. Therefore, in addition to the functions of the first and second embodiments, the thicknesses of the crystal layers which are partially removed by etching can be made thinner, thereby resulting in improved precision in the etching.

As described above, in the third embodiment of the invention, the blue LED is formed as in the first embodiment and the red LED is formed as in the second embodiment, and the n type GaP layer 12 and the p type GaP layer 11 are successively grown on the n type GaP substrate 13 to form the green LED. Then, after the p type GaP layer 11 of the green LED and the p type GaN contact layer 26 of the blue LED are directly adhered to each other, the n type GaP substrate 13 of the green LED is removed. Further, after the n type $Ga_{0.3}Al_{0.7}As$ contact layer 5 of the red LED and the n type GaP layer 12 of the green LED are directly adhered to each other, the p type GaAs substrate 1 of the red LED is removed. Therefore, without including the p type GaAs substrate 1 and the n type GaP substrate 13 in the element structure, the thickness of the element can be made thinner than those in the first and second embodiments, thereby improving the precision in etching to the n type GaP layer 12 and the p type GaN contact layer 26, in addition to the functions of the first and second embodiments.

[Embodiment 4]

Figure 5:
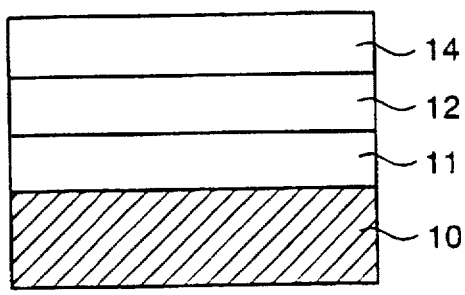
FIGS. 5(a)–5(c) are sectional views illustrating process steps in a method of fabricating an LED device in accordance with a fourth embodiment of the present invention.
Figure 5:
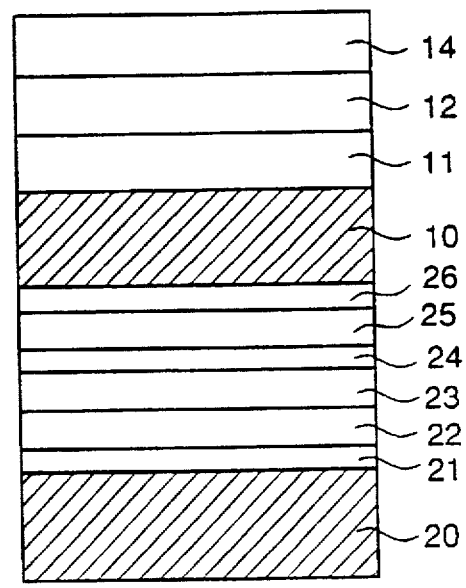
Figure 5:
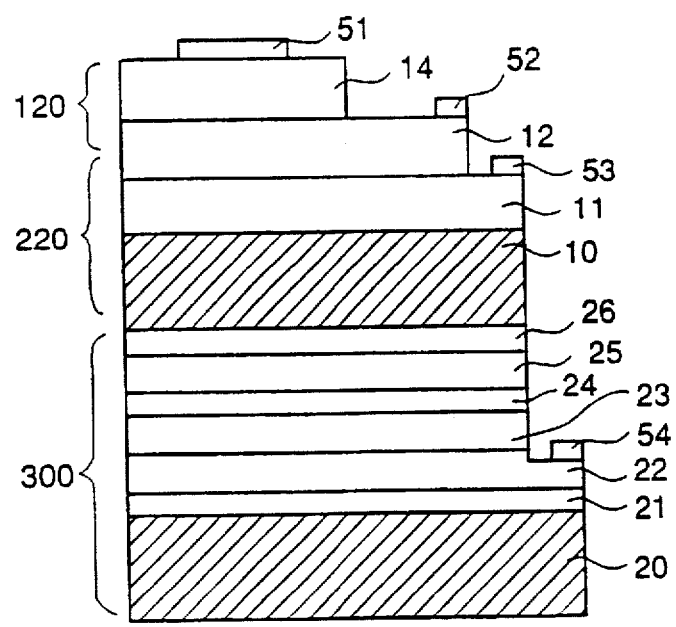

FIGS. 5(a)–5(c) are sectional views illustrating process steps in a method of fabricating an LED device, according to a fourth embodiment of the present invention. In the fourth embodiment of the invention, the red and green LEDs are successively formed on a common substrate.

The blue LED is formed as in the first embodiment of the invention. In the red and green LEDs, as shown in FIG. 5(a), a p type (Zn-doped) GaP layer 11, an n type GaP layer 12, and a p type (ZnO-doped) GaP layer 14 are successively grown on a p type GaP substrate 10 using LPE. These red and green LEDs emit the red light between the p type GaP layer 11 and the n type GaP layer 12 and emit the red light between the n type GaP layer 12 and the p type GaP layer 14.

After the formation of the red and green LEDs, surface processing is performed, followed by rinsing drying. In the step of FIG. 5(b), the p type GaP substrate 10 of the red and green LEDs is adhered directly to the p type GaN contact layer 26 of the blue LED by performing annealing. Using ordinary photoresist and etching techniques for the united device, portions of the LEDs are respectively removed and then, electrodes are formed on the p type GaP layer 14 and the exposed surfaces of the n type GaP layer 12, the p type GaP layer 11, and the n type GaN contact layer 22, which are formed after the respective portions of the LEDs are removed as shown in FIG. 5(c).

A description is given of the function of the device.

The red and green LEDs are formed by a process in which the p type GaP layer 11, the n type GaP layer 12, and the p type GaP layer 14 are successively grown on the p type GaP substrate 10 serving as a common substrate, thereby shortening the forming process of the red LED, omitting the adhering process of the red and green LEDs, and forming the element without using a substrate for the red LED.

As described above, in the fourth embodiment of the invention, the blue LED is formed as in the first embodiment of the invention, and the p type (Zn-doped) GaP layer 11, the n type GaP layer 12, and the p type (ZnO-doped) GaP layer 14 are successively grown on the p type GaP substrate 10 to form the red and green LEDs, thereby shortening the process of forming the red LED, omitting the process of adhering a red and green LEDs, and the element not including the substrate for the red LED is formed.

[Embodiment 5]

FIGS. 6(a)–6(d) are sectional views illustrating process steps in a method of fabricating an LED device, according to a fifth embodiment of the present invention. In the fifth embodiment of the invention, the growth order of the layers of the red and green LEDs described in the fourth embodiment of the invention is reversed, and the common substrate is removed after the adhering process, whereby the thickness of the element is made thinner.

Figure 6:
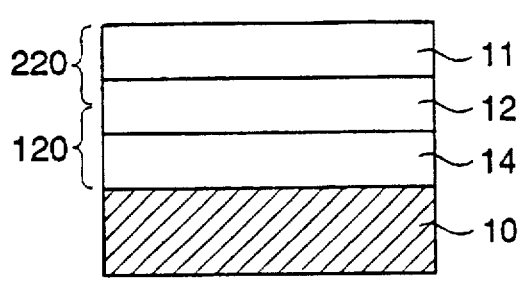
FIGS. 6(a)–6(d) are sectional views illustrating process steps in a method of fabricating an LED device in accordance with a fifth embodiment of the present invention.
Figure 6:
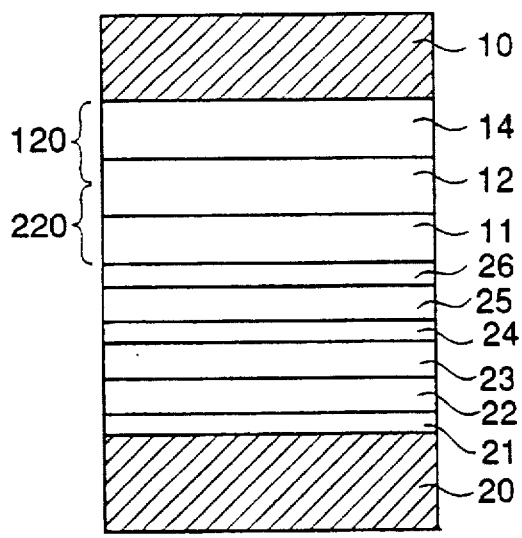
Figure 6:
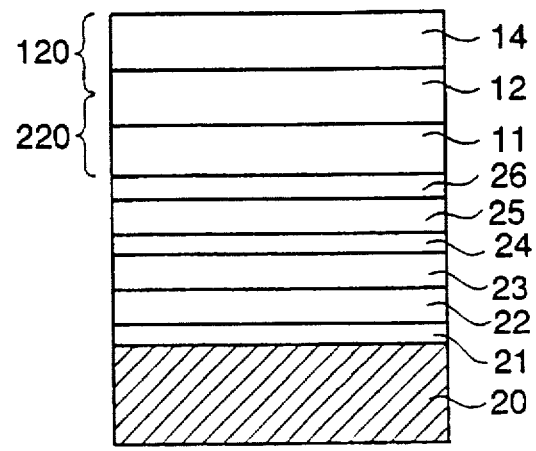
Figure 6:
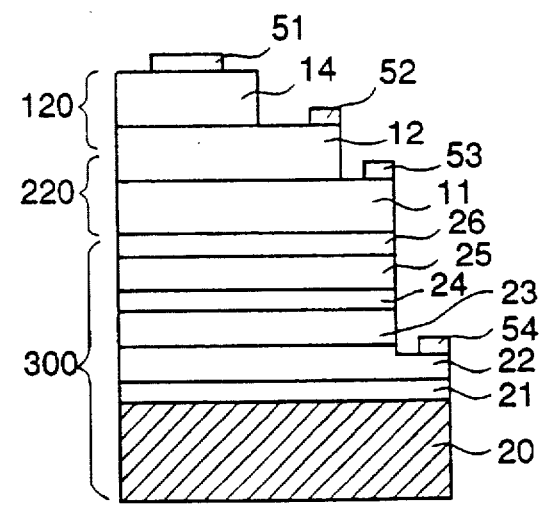

The blue LED is formed as in the first embodiment of the invention. In the fourth embodiment of the invention, the crystal for the red LED is grown on the crystal for the green LED. In this fifth embodiment, however, as shown in FIG. 6(a), using LPE (liquid phase epitaxy), a p type (ZnO-doped) GaP layer 14 and an n type GaP layer 12, both of which make a p-n junction of the red LED, and a p type (Zn-doped) GaP layer 11, which makes a p-n junction of the green LED with the n type GaP layer 12, are successively grown on a p type GaP substrate 10 serving as a common substrate of the red and green LEDs. After surface processing is performed the device and is rinsed and dried, the p type GaP layer 11 of the green LED and the p type GaN contact layer 26 of the blue LED are directly adhered to each other by performing annealing as shown in FIG. 6(b). Then, as shown in FIG. 6(c), the p type GaP substrate 10, which is a common substrate for the green LED and the red LED, is removed. In the step of FIG. 6(d), portions of the LEDs are respectively removed and then, electrodes 51 to 54 are formed on the p type GaP layer 14 and on the exposed surfaces of the n type GaP layer 12, the p type GaP layer 11, and the n type GaN contact layer 22, respectively, which exposed surfaces are formed after the respective portions of the LEDs are removed.

A description is given of the function of the device.

In this fifth embodiment of the invention, the red and green LEDs are formed by a process in which the p type GaP layer 14, the n type GaP layer 12, and the p type GaP layer 11 are successively grown in an order reverse to that in the fourth embodiment on the p type GaP substrate 10 serving as a common substrate. Therefore, the p type GaP substrate 10 is removed after the adhering process, whereby the thickness of the crystal layers which are partially removed by the etching for forming the regions on which the electrodes are formed can be made thinner. In forming the electrodes, a ten-odd μm thick portion from the p type GaP cladding layer 14 to the n type GaN contact layer 22 has only to be removed by etching.

As described above, in the fifth embodiment of the invention, the blue LED is formed as in the first embodiment, and the p type GaP layer 14, the n type GaP layer 12, and the p type GaP layer 11 are successively grown on the p type GaP substrate 10 to form the red and green LEDs. Then, after the p type GaP layer 11 of the red and green LEDs and the p type GaN contact layer 26 of the blue LED are directly adhered to each other, the p type GaP substrate 10 serving as a common substrate for the red and green LEDs is removed. Thereafter, portions of the LEDs are respectively removed and then, electrodes are formed on the p type GaP layer 14 and on the exposed surfaces of the n type GaP layer 12, the p type GaP layer 11, and the n type GaN contact layer 22, respectively, which exposed portions are formed after the respective portions of the LEDs are removed. Therefore, in addition to the function of the fourth embodiment, the thickness of the crystal layers which are partially removed by the etching can be made thinner, thereby improving precision in performing the etching.

[Embodiment 6]

Figure 7:
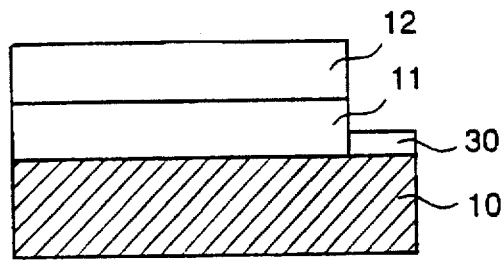
FIGS. 7(a)–7(c) are sectional views illustrating process steps in a method of fabricating an LED device in accordance with a sixth embodiment of the present invention.
Figure 7:
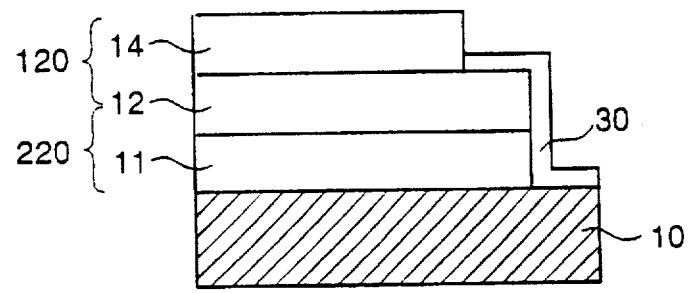
Figure 7:
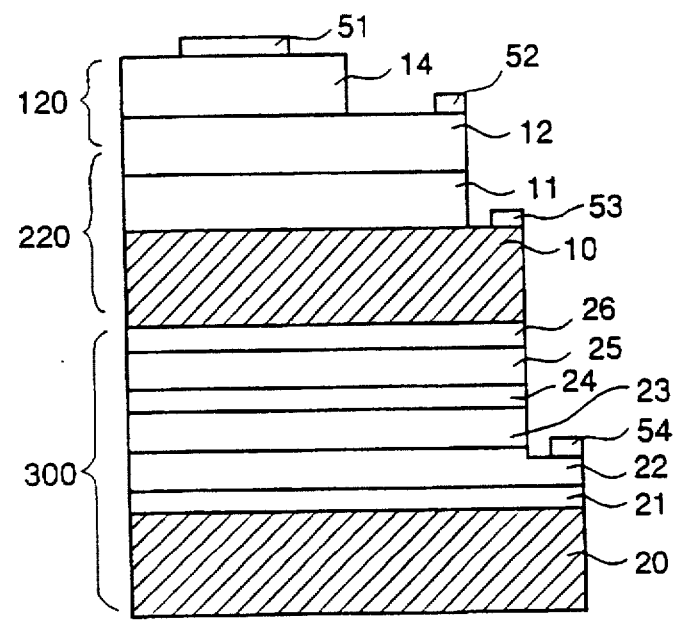

FIGS. 7(a)-7(c) are sectional views illustrating process steps in a method of fabricating an LED device according to a sixth embodiment of the present invention. In the sixth embodiment of the invention, the crystal layers of the red and green LEDs are grown by selective growth with regions for forming electrodes, whereby the etching process is simplified.

The blue LED is formed as in the first embodiment of the invention. In the fabrication of the red and green LEDs, as shown in FIG. 7(a), an SiO₂ film 30 is deposited by sputtering in a stripe shape using an ordinary photoresist technique on a region of a p type GaP substrate 10 serving as a common substrate for the red and preen LEDs, where an electrode 53 is to be formed as shown in FIG. 7(a), and then, a p type GaP layer 11 and an n type GaP layer 12 both of which make a p-n junction of the preen LED are successively grown on the remaining region of the substrate 10. Then, an SiO₂ film 30 is again deposited into a stripe shape on the side surfaces of the p type GaAs layer 11 and the n type GaAs layer 12 and on a part of the upper surface of the n type GaAs layer 12, as shown in FIG. 7(b). Then, a p type GaP layer 14 which makes a p-n junction of the red LED with the n type GaAs layer 12 is grown on the remaining surface of the n type GaAs layer After removing the SiO₂ film 30 with HF, as in the fourth embodiment, the p type GaN contact layer 26 of the blue LED which is grown on the sapphire substrate 20 and the p type GaP substrate 10 which is common for the red and green LEDs are directly adhered to each other by performing annealing. In the step of FIG. 7(c), using an ordinary photoresist technique, a portion of the n type GaN contact layer 22 of the blue LED is removed to form a step and then, electrodes 51 to 54 are formed on a surface of the p type GaP layer 14, on end regions of the surfaces of the n type GaP layer 12 and the p type GaP substrate 10, and on the exposed surface of the n type GaN contact layer 22, respectively.

A description is given of the function of the device.

In the sixth embodiment of the invention, in the growth process of the red and green LEDs, spaces for forming the electrodes are formed employing a selective mask. Therefore, the number of processes for forming the spaces for electrodes by etching can be reduced.

As described above, in the sixth embodiment of the invention, the blue LED is formed as in the first embodiment of the invention, and the red and green LEDs are formed by processes of forming an SiO₂ film 30 serving as a selective mask in a stripe shape on a region of the p type GaP substrate 10, successively growing the p type GaP layer 11 and the n type GaP layer 14 on the remaining region of the substrate, forming again an SiO₂ film to form a stripe having an aperture at a region where the p type GaP layer 14 is grown, and growing the type GaP layer 14. Therefore, in addition to the function of the fourth embodiment, the number of processes for forming the spaces for electrodes by etching can be reduced, thereby simplifying the fabrication process.

[Embodiment 7]

FIGS. 8(a)-8(d) are sectional views illustrating process steps in a method of fabricating an LED device according to a seventh embodiment of the present invention. In the seventh embodiment of the invention, three (51 to 53) among the four electrodes 51 to 54 which are provided for controlling the light emittion intensity of the respective LEDs are located in the same plane.

The blue LED is formed as in the first embodiment of the invention. In the fabrication of the red and green LEDs, using an ordinary photoresist technique, an SiO₂ film 31 having a stripe-shaped opening in [11T] direction is deposited by sputtering on a p type GaP substrate 10 and then, using the SiO₂ film 31 as a mask, the p type GaP substrate 10 is etched, as shown in FIG. 8(a).

Figure 8:
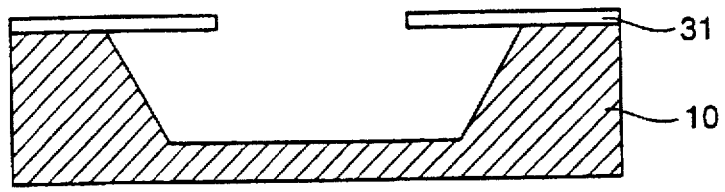
FIGS. 8(a)–8(d) are sectional views illustrating process steps in a method of fabricating an LED device in accordance with a seventh embodiment of the present invention.
Figure 8:
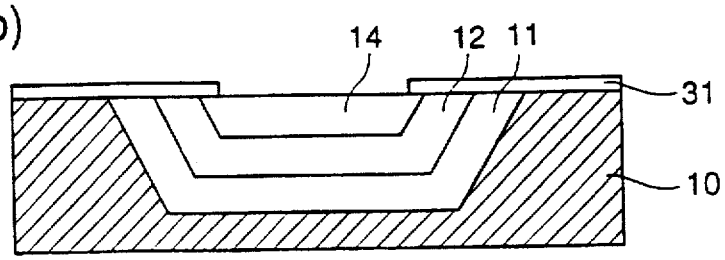
Figure 8:
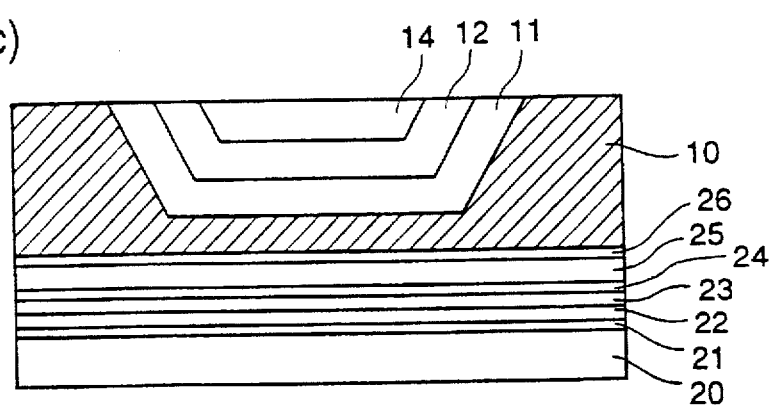
Figure 8:
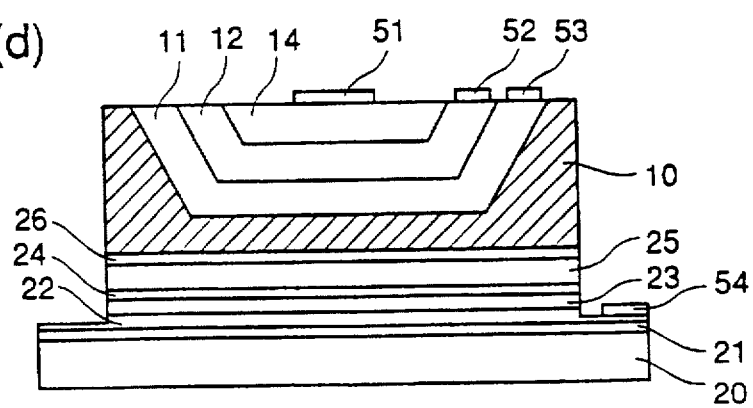

As shown in FIG. 8(b), using the SiO₂ film 31 as a mask, a p type (Zn-doped) GaP layer 11, an n type GaP layer 12, and a p type (ZnO-doped) GaP layer 14 are successively grown on the region of the p type GaP substrate 10 which is formed by the etching, employing LPE or VPE. After removing the SiO₂ film 31 with HF, as in the fourth embodiment of the invention, the p type GaN contact layer 26 of the blue LED which is grown on the sapphire substrate 20 and the p type GaP substrate 10 for the red and green LEDs are directly adhered to each other by performing annealing as shown in FIG. 8(c). In the step of FIG. 8(d), using an ordinary photoresist technique, portions of the LEDs are removed and then, electrodes 51 to 54 are formed on the p type GaP layer 14, on the n type GaP layer 12, on the p type GaP layer 11, and on one of the exposed surfaces of the n type GaN contact layer 22, respectively.

A description is given of the function.

In the seventh embodiment of the invention, a mask having a stripe-shaped opening in [11T] direction is formed on the p type GaP substrate 10, and using the mask, the p type GaP substrate 10 is etched. Thereby, the p type GaAs substrate 10 is etched into a reverse mesa shape. Further, as shown in FIG. 8(b), when the p type GaP layer 11, the n type GaP layer 12, and the p type GaP layer 14 are successively grown on the etched region of the substrate 10, the crystal layers are grown along the side wall of the etched region so that the edge portions of respective crystal layers are exposed on the same level with the surface of the p type GaP substrate 10. In this way, the electrodes are formed on the exposed edge parts of the crystal layers and thus they are located in on the same plane, whereby the number of processes for forming the spaces for electrodes can be reduced.

As described above, in the seventh embodiment of the invention, the blue LED is formed as in the first embodiment of the invention and the red and green LEDs are fabricated by the processes of forming an SiO$_2$ film 31 comprising a line in the [11T] direction on the p type GaP substrate 10, etching the p type GaAs substrate 10 using the same as a mask, successively growing the p type (Zn-doped) GaP layer 11, the n type GaP layer 12, the p type (ZnO-doped) GaP layer 14, removing the SiO$_2$ film 31, adhering the p type GaN contact layer 26 of the blue LED and the p type GaP substrate 10 by annealing, forming a step on the n type GaN contact layer 22, and forming electrodes 51 to 54 on the p type (ZnO doped) GaP layer 14, the n type GaP layer 12, the p type (Zn doped) GaP layer 11, and the n type GaN contact layer 22, respectively. Therefore, the electrodes 51 to 54 can be formed on the same plane, the processes for providing spaces for the electrodes by etching can be eliminated, thereby simplifying the fabrication process. In addition, a visible light LED device having three electrodes in the same plane can be realized.

[Embodiment 8]

Figure 9:
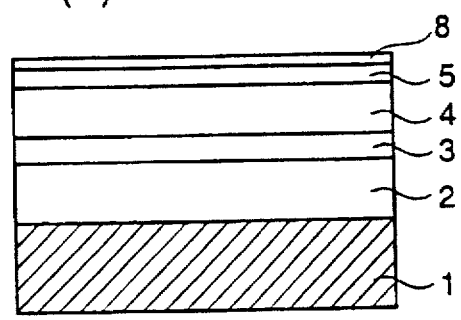
FIGS. 9(a) and 9(b) are sectional views illustrating process steps in a method of fabricating an LED device in accordance with an eighth embodiment of the present invention.
Figure 9:
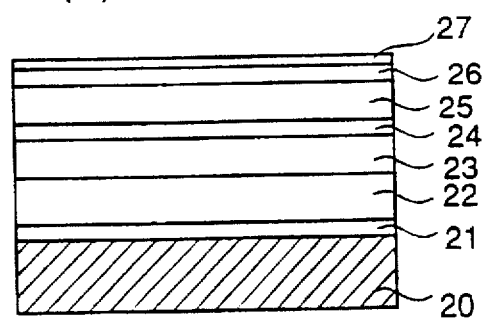

FIGS. 9(a) and 9(b) are sectional views illustrating process steps in a method of fabricating an LED device, according to an eighth embodiment of the present invention. In the eighth embodiment of the invention, a thin layer including In is formed on at least one of the adhered surfaces of the LEDs which are to be adhered to each other, and the adhesion of the LEDs is performed via the thin layer. A description is given of this adhesion using the structure in the first embodiment of the invention.

In the fabrication of the red LED, the crystal layers are grown in the same way as in the first embodiment, and an n type $InxGa_{0.3-x}Al_{0.7}As$ layer 8 (0<x<0.3) having a thickness of several atomic layers is grown on the n type GaAlAs contact layer 5 shown in FIG. 9(a).

In the fabrication of the blue LED, the crystal layers are grown in the same way as in the first embodiment, and a p type $In_yGa_{1-y}N$ layer 27 (0<y<0.5) having a thickness of several atomic layers is grown on the p type GaN contact layer 26 shown in FIG. 9(b).

These red and blue LEDs fabricated as described above and the green LED fabricated as in the first embodiment are adhered by performing annealing in the same way as in the first embodiment.

A description is given of the function of the device.

When the LEDs which are thus fabricated are adhered to each other by performing annealing, the crystal structure includes In at the adhered surfaces. Since the mass transport function of In directly simplifies movement of atoms at the adhered surfaces of the LEDs, the adhesion of the crystal layers is made highly reliable. In this case, due to including In at the adhered surfaces of the LEDs, the band gap energy thereat becomes small. However, since the layers including In are quite thin, i.e., several atomic layers thick, there is very little absorption of light thereby having no effects on the device characteristics.

As described above, in the eighth embodiment of the invention, because a layer including In is formed on at least one of the adhered surfaces of the LEDs, the adhesion of the layers is largely improved. Although in this eighth embodiment adhesion of the device of the first embodiment is described, the same effects are obtained also in the devices of the other embodiments described above.

In addition, throughout the specification, for example, [11T] direction or <11T> direction is used to represent the [111] direction or <111> direction. Similary, the notation / in the parenthesis [ ] or < > is used to represent - (bar) which means an inversion.

What is claimed is:

1. A light emitting diode (LED) device producing visible light comprising:
   a blue LED including semiconductor crystal layers for emitting blue light;
   a green LED including semiconductor crystal layers for emitting green light; and
   a red LED including semiconductor crystal layers for emitting red light, the blue, green, and red LEDs being Laminated and united serially in a stack.

2. A light emitting diode (LED) device producing visible light comprising:
   a blue LED including semiconductor crystal layers for emitting blue light; and
   a green and red LED including semiconductor crystal layers for, respectively, emitting green and red light, the blue LED and the green and red LED being laminated and united serially in a stack.

3. The LED device of claim 1 wherein:
   the blue LED comprises a substrate, a first conductivity type crystal layer, and a second conductivity type crystal layer successively disposed in this order on the substrate of the blue LED;
   the green LED comprises a second conductivity type substrate, a second conductivity type crystal layer, and a first conductivity type crystal layer successively disposed in this order on the second conductivity type substrate of the green LED;
   the red LED comprises a second conductivity type substrate, a second conductivity type crystal layer, and a first conductivity type crystal layer successively disposed in this order on the second conductivity type substrate of the red LED, a crystal layer of the blue LED being united directly with the second conductivity type substrate of the green LED and a crystal layer of the green LED being united directly with a crystal layer of the red LED;
   an electrode of the red LED is disposed on the second conductivity type substrate of the red LED;
   an electrode common to the green LED and the red LED is disposed on a region of the first conductivity type crystal layer of the green LED;
   an electrode common to the blue LED and the green LED is disposed on a region of the second conductivity type crystal layer of the blue LED; and
   an electrode of the blue LED is disposed on a region of the first conductivity type crystal layer of the blue LED.

4. The LED device of claim 1 wherein:
   the blue LED comprises a substrate, a first conductivity type crystal layer, and a second conductivity type crystal layer successively disposed in this order on the substrate of the blue LED;
   the green LED comprises a second conductivity type substrate, a second conductivity type crystal layer, and a first conductivity type crystal layer successively disposed in this order on the second conductivity type substrate of the green LED;
   the red LED comprises a second conductivity type substrate, a second conductivity type crystal layer, and a first conductivity type crystal layer successively disposed in this order on the second conductivity type substrate of the red LED, a crystal layer of the blue LED being united directly with the second conductivity type substrate of the green LED and a crystal layer of the green LED being united directly with a crystal layer of the red LED;

an electrode of the red LED is disposed on the second conductivity type crystal layer of the red LED;

an electrode common to the green LED and the red LED is disposed on a region of the first conductivity type crystal layer of the green LED;

an electrode common to the blue LED and the green LED is disposed on a region of the second conductivity type crystal layer of the blue LED; and an electrode of the blue LED is disposed on a region of the first conductivity type crystal layer of the blue LED.

5. The LED device of claim 1 wherein:

the blue LED comprises a substrate, a first conductivity type crystal layer, and a second conductivity type crystal layer successively disposed in this order on the substrate of the blue LED;

the green LED comprises a first conductivity type substrate, a first conductivity type crystal layer, and a second conductivity type crystal layer successively disposed in this order on the first conductivity type substrate of the green LED;

the red LED comprises a second conductivity type substrate, a second conductivity type crystal layer, and a first conductivity type crystal layer successively disposed in this order on the second conductivity type substrate of the red LED, a crystal layer of the blue LED being united directly with a crystal layer of the green LED and the first conductivity type crystal layer of the green LED being united directly with a grown crystal layer of the red LED;

an electrode of the red LED disposed on the second conductivity type crystal layer of the red LED;

an electrode common to the green LED and the red LED is disposed on a region of the first conductivity type crystal layer of the green LED;

an electrode common to the blue LED and the green LED is disposed on a region of the second conductivity type crystal layer of the blue LED; and an electrode of the blue LED is disposed on a region of the first conductivity type crystal layer of the blue LED.

6. The LED device of claim 2 wherein:

the blue LED comprises a substrate, a first first conductivity type crystal layer, and a first second conductivity type crystal layer successively disposed in this order on the substrate of the blue LED;

the green and red LED comprises a second conductivity type substrate, a second second conductivity type crystal layer, and a second first conductivity type crystal layer making a p-n junction for emitting green light, and a third second conductivity type crystal layer making a p-n junction with the second first conductivity type crystal layer for emitting red light, successively disposed in this order on the second conductivity type substrate of the green and red LED, a crystal layer of the blue LED being united directly with the substrate of the green and red LED;

an electrode of the green and red LED is disposed on the second conductivity type substrate of the green and red LED;

an electrode common to the green and red LED is disposed on a region of the second first conductivity type crystal layer;

an electrode common to the blue LED and the green and red is LED disposed on a region of the second second conductivity type crystal layer; and an electrode of the blue LED is disposed on a region of the first first conductivity type crystal layer.

7. The LED device of claim 2 wherein:

the blue LED comprises a substrate, a first first conductivity type crystal layer, and a first second conductivity type crystal layer successively disposed in this order on the substrate of the blue LED;

the green and red LED comprises a second conductivity type substrate, a second second conductivity type crystal layer, and a second first conductivity type crystal layer making a p-n junction for emitting red light, and a third second conductivity type crystal layer making a p-n junction with the second first conductivity type crystal layer for emitting green light, successively disposed in this order on the second conductivity type substrate of the the green and red LED, a crystal layer of the blue LED being united directly with a crystal layer of the green and red LED;

an electrode is disposed on a region of the second second conductivity type crystal layer.

an electrode common to the green and red LED is disposed on a region of the second first conductivity type crystal layer;

an electrode common to the blue LED and the green and red LED is disposed on a region of the third second conductivity type crystal layer; and an electrode of the blue LED is disposed on a region of the first first conductivity type crystal layer.

8. The LED device of claim 2 wherein:

the blue LED comprises a substrate, a first first conductivity type crystal layer, and a first second conductivity type crystal layer successively disposed in this order on the substrate of the blue LED;

the green and red LED comprises a second conductivity type substrate, a second second conductivity type crystal layer, and a second first conductivity type crystal layer making a p-n junction for emitting green light, on a first region of the substrate of the green and red LED, and a third second conductivity type crystal layer making a p-n junction with the second first conductivity type crystal layer for emitting red light, on a second region of the second first conductivity type crystal layer;

a crystal layer of the blue LED is united directly with the substrate of the green and red LED;

an electrode of the green and red LED is disposed on the substrate of the green and red LED;

an electrode common to the green and red LED is disposed on a region of the second first conductivity type crystal layer, excluding the second region;

an electrode common to the blue LED and the green and red LED is disposed on a region of the substrate of the green and red LED, excluding the first region; and an electrode of the blue LED is disposed on a region of the first first conductivity type crystal layer.

9. The LED device of claim 2 wherein:

the blue LED comprises a substrate, a first first conductivity type crystal layer, and a first second conductivity type crystal layer successively disposed in this order on the substrate of the blue LED;

the green and red LED comprises a second conductivity type substrate having a recess with at least one inclined side surface so that the recess broadens toward a surface of the substrate;

the green and red LED comprises a second second conductivity type crystal layer and a second first conductivity type crystal layer making a p-n junction for emitting green light, and a third second conductivity type crystal layer making a p-n junction with the second first conductivity type crystal layer for emitting red light, successively disposed in this order in the recess in the substrate of the green and red LED so that the second second conductivity type crystal layer and the second first conductivity type crystal layer are exposed on a common planar surface with the third second conductivity type crystal layer;

a crystal layer of the blue LED is united directly with the substrate of the green and the red LED;

an electrode of the green and red LED is disposed on the substrate of the green and red LED;

an electrode common to the green and red LED is disposed on a region of the common planar surface;

an electrode common to the blue LED and the green red LED is disposed on a region of the second second conductivity type crystal layer; and an electrode of the blue LED is disposed on a region of the first first conductivity type crystal layer.

10. The LED device of claim 1 including a compound semiconductor film including In disposed on at least one of the LEDs united directly with another of the LEDs.

11. The LED device of claim 2 including a compound semiconductor film including In disposed on at least one of the blue LED and the red and green LED united directly with the other of the blue LED and red and green LED.

12. The LED device of claim 3 including compound semiconductor films including In disposed on at least one of a crystal layer of the blue LED and the second conductivity type substrate of the green LED and on at least one of the crystal layers of the green LED and the red LED, respectively.

13. The LED device of claim 4 including compound semiconductor films including In disposed on at least one of a crystal layer of the blue LED and the second conductivity type substrate of the green LED and on at least one of the crystal layers of the green LED and the red LED, respectively.

14. The LED device of claim 5 including compound semiconductor films including In disposed on at least one of a crystal layer of the blue LED and the green LED and on at least one of the of the first conductivity type crystal layer of the green LED and a crystal layer of the red LED.

15. The LED device of claim 6 including a compound semiconductor film including In disposed on at least one of a crystal layer of the blue LED and the substrate of the green and red LED.

16. The LED device of claim 7 including a compound semiconductor film including In disposed on at least one of a crystal layer of the blue LED and a crystal layer of the green and red LED.

17. The LED device of claim 8 including a compound semiconductor film including In disposed on at least one of a crystal layer of the blue LED and the substrate of the green and red LED.

18. The LED device of claim 9 including a compound semiconductor film including In disposed on at least one of a crystal layer of the blue LED and the substrate of the green and red LED.

19. The LED device of claim 3 wherein:

the blue LED comprises a GaN buffer layer, an n type GaN contact layer, an n type AlGaN cladding layer, a p type InGaN active layer, a p type AlGaN cladding layer, and a p type GaN contact layer disposed in this order and the substrate of the blue LED is sapphire;

the green LED comprises a p type GaP layer and an n type GaP layer disposed in this order and the second conductivity type substrate of the green LED is p type GaP; and the red LED comprises a p type GaAlAs cladding layer, a p type GaAlAs active layer, an n type GaAlAs cladding layer, and an n type GaAlAs contact layer disposed in this order and the second conductivity type substrate of the red LED is p type GaAs.

20. The LED device of claim 4 wherein:

the blue LED comprises a GaN buffer layer, an n type GaN contact layer, an n type AlGaN cladding layer, a p type InGaN active layer, a p type AlGaN cladding layer, and a p type GaN contact layer disposed in this order and the substrate of the blue LED is sapphire;

the green LED comprises a p type GaP layer and an n type GaP layer disposed in this order and the second conductivity type substrate of the green LED is p type GaP; and the red LED comprises a p type GaAlAs buffer layer, a p type GaAlAs cladding layer, a p type GaAlAs active layer, an n type GaAlAs cladding layer, and an n type GaAlAs contact layer disposed in this order and the second conductivity type substrate of the red LED is p type GaAs.

21. The LED device of claim 5 wherein:

the blue LED comprises a GaN buffer layer, an n type GaN contact layer, an n type AlGaN cladding layer, a p type InGaN active layer, a p type AlGaN cladding layer, and a p type GaN contact layer disposed in this order and the substrate of the blue LED is sapphire;

the green LED comprises an n type GaP layer and a p type GaP layer disposed in this order and the second conductivity type substrate of the green LED is n type GaP; and the red LED comprises a p type GaAlAs buffer layer, a p type GaAlAs cladding layer, a p type GaAlAs active layer, an n type GaAlAs cladding layer, and an n type GaAlAs contact layer disposed in this order and the second conductivity type substrate of the red LED is p type GaAs.

22. The LED device of claim 6 wherein:

the blue LED comprises a GaN buffer layer, an n type GaN contact layer, an n type AlGaN cladding layer, a p type InGaN active layer, a p type AlGaN cladding layer, and a p type GaN contact layer disposed in this order and the substrate of the blue LED is sapphire; and the green and red LED comprises a first p type GaP layer and an n type GaP layer making a p-n junction, and a second p type GaP layer making a p-n junction with the n type GaP layer, disposed in this order and the substrate of the green and red LED is p type GaP.

23. The LED device of claim 7 wherein:

the blue LED comprises a GaN buffer layer, an n type GaN contact layer, an n type AlGaN cladding layer, a p type InGaN active layer, a p type AlGaN cladding layer, and a p type GaN contact layer disposed in this order and the substrate of the blue LED is sapphire; and the green and red LED comprises a first p type GaP layer, an n type GaP layer making a p-n junction, and a second p type GaP layer making a p-n junction with the n type GaP layer, disposed in this order and the substrate of the green and red LED is p type GaP.

24. The LED device of claim 8 wherein:

the blue LED comprises a GaN buffer layer, an n type GaN contact layer, an n type AlGaN cladding layer, a p type InGaN active layer, a p type AlGaN cladding layer, and a p type GaN contact layer disposed in this order and the substrate of the blue LED is sapphire; and the green and red LED comprises a first p type GaP layer and an n type GaP layer making a p-n junction at the first region of the substrate of the green and red LED, and a second p type GaP layer making a p-n junction with the n type GaP layer at a second region of the n type GaP layer.

25. The LED device of claim 9 wherein:

the blue LED comprises a GaN buffer layer, an n type GaN contact layer, an n type AlGaN cladding layer, a p type InGaN active layer, a p type AlGaN cladding layer, and a p type GaN contact layer disposed in this order and the substrate of the blue LED is sapphire;

the second second conductivity type crystal layer of the green and red LED comprises p type GaP;

the second first conductivity type crystal layer of the green and red LED comprises n type GaP;

the third second conductivity type crystal layer of the green and red LED comprises p type GaP; and the second conductivity type substrate of the green and red LED comprises p type GaP.

* * * * *